United States Patent [19]

Lovgren et al.

[11] Patent Number: 4,484,178
[45] Date of Patent: Nov. 20, 1984

[54] DIGITAL-TO-ANALOG CONVERTER

[75] Inventors: Jeffrey L. Lovgren, Rochester, Minn.; George C. Thomas, Longmont, Colo.; John T. Trnka, Rochester, Minn.

[73] Assignee: International Business Machines Corporation, Armonk, N.Y.

[21] Appl. No.: 391,059

[22] Filed: Jun. 22, 1982

[51] Int. Cl.³ .............................................. H03K 13/02
[52] U.S. Cl. ........................ 340/347 DA; 340/347 M
[58] Field of Search .... 340/347 M, 347 DA, 347 CC; 318/341, 345 E

[56] References Cited

U.S. PATENT DOCUMENTS

| | | | |
|---|---|---|---|
| 3,257,595 | 6/1966 | Polakowski | 318/314 |
| 3,705,359 | 12/1972 | Kappes | 329/104 |
| 3,742,487 | 6/1973 | Tripp | 340/347 |
| 3,789,393 | 1/1974 | Tripp | 340/347 DA |
| 3,883,785 | 5/1975 | Fulcher et al. | 318/314 |
| 3,883,786 | 5/1975 | NcNaughton et al. | 318/317 |
| 3,893,102 | 7/1975 | Candy | 340/347 M X |
| 4,006,475 | 2/1977 | Candy et al. | 340/347 DA |
| 4,016,558 | 4/1977 | Bishop et al. | 340/347 |
| 4,087,754 | 5/1978 | Song | 325/38 B |
| 4,109,110 | 8/1978 | Gingell | 179/15 AP |
| 4,243,921 | 1/1981 | Tamura et al. | 318/314 |
| 4,254,367 | 3/1981 | Sakamoto | 318/314 |

Primary Examiner—T. J. Sloyan
Attorney, Agent, or Firm—Homer L. Knearl

[57] ABSTRACT

The digital-to-analog converter described herein generates an analog signal level from a digital value and a modulation coefficient. The converter modulates the digital word applied to the conversion stages and smoothes the resultant duty cycle modulated analog levels to produce additional analog levels between the normal levels provided by the conversion stages of the DAC. In one embodiment the duty cycle modulation of the digital value is accomplished by a rate multiplier controlling the incrementing of the digital word applied to the conversion stages. In another embodiment of the invention, the duty cycle modulation of the digital word is performed by a microcomputer. A low pass filter or a DC motor is used to smooth or filter the duty cycle modulated levels from the conversion stages.

3 Claims, 10 Drawing Figures

15% DUTY CYCLE

60% DUTY CYCLE

87% DUTY CYCLE

DIGITAL-TO-ANALOG CONVERTER

FIELD OF THE INVENTION

This invention relates to a digital-to-analog converter (DAC). More particularly it relates to a DAC capable of producing more output analog values than the number of digital-to-analog conversion stages in the DAC.

BACKGROUND OF THE INVENTION

In a typical DAC, the digital value is converted to an analog signal level by using each digital bit to generate its equivalent analog level and by summing all such analog levels to produce the resultant analog conversion. An example of a binary digital-to-analog converter is shown in U.S. Pat. No. 3,705,359 issued to Werner Kappes.

In the Kappes patent, a voltage divider is used to create the analog level for each bit of the input digital word. The analog levels are summed by an operational amplifier. Each bit controls whether its associated analog value is applied to the operational amplifier for summing with the other converted bit values.

While the Kappes technique works very well, it is expensive to implement because of the requirement that each bit have a corresponding analog conversion stage. For example to produce sixty four analog levels, six conversion stages are required. A significant cost savings could be realized if the same number of analog levels could be realized with fewer conversion stages.

SUMMARY OF THE INVENTION

This invention has solved the above problem by generating an analog signal level from a digital value and a modulation coefficient. The invention uses fewer conversion stages, duty cycle modulates the digital word applied to the conversion stages and smoothes the resultant duty cycle modulated analog levels to produce additional analog levels between the normal levels provided by the conversion stages of the DAC. For example, if the DAC has four stages, it would normally produce sixteen analog levels. By duty cycle modulating the digital input to the conversion stages of the DAC, a signal equivalent to additional analog levels between the sixteen levels available from the conversion stages may be produced. If the four bit input word to the four conversion stages is duty cycle modulated with sixteen proportional intervals within the duty cycle period, the DAC can produce the equivalent in energy content of 256 analog levels rather than sixteen levels.

To smooth or filter the duty cycle modulated levels from the conversion stages, electronic or electromagnetic devices may be used. If the duty cycle modulated DAC is used to drive a DC motor, the frequency response of the motor smooths the speed of the motor, and the duty cycle modulation of the excitation of the motor is not apparent. If the duty cycle modulated DAC is used with electronic circuits, a low pass filter will eliminate modulation of the DAC output and produce a smooth output voltage level.

BRIEF DESCRIPTION OF DRAWINGS

The invention is described in detail below with reference to drawings, illustrating specific embodiments of the invention, in which.

Figure 4:
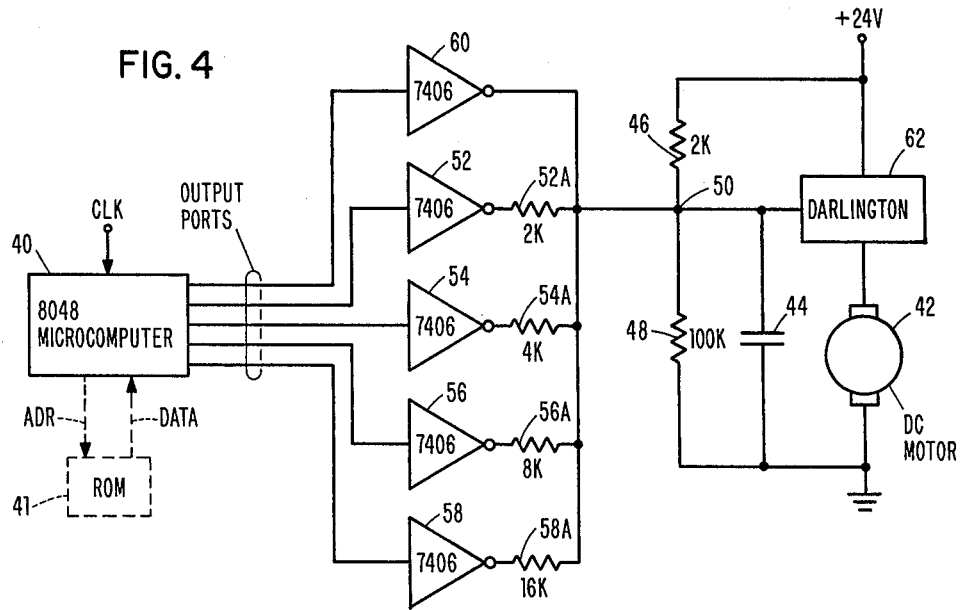
FIG. 4 shows another preferred embodiment of the invention where the duty cycle, digital word generator is implemented by a programmed microcomputer and the modulated analog levels are smoothed out by the charteristic response of a DC motor.
Figure 5A:
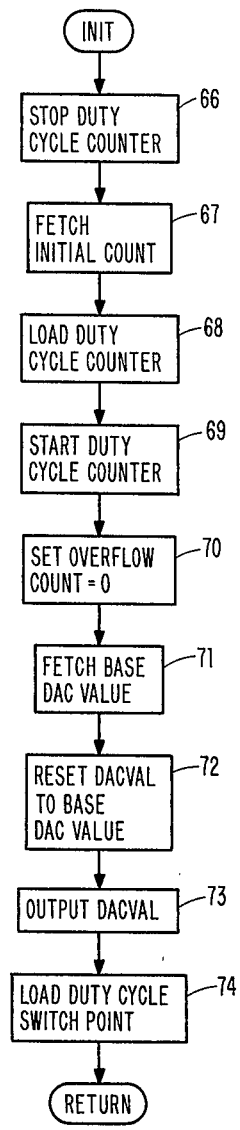
Figure 5B:
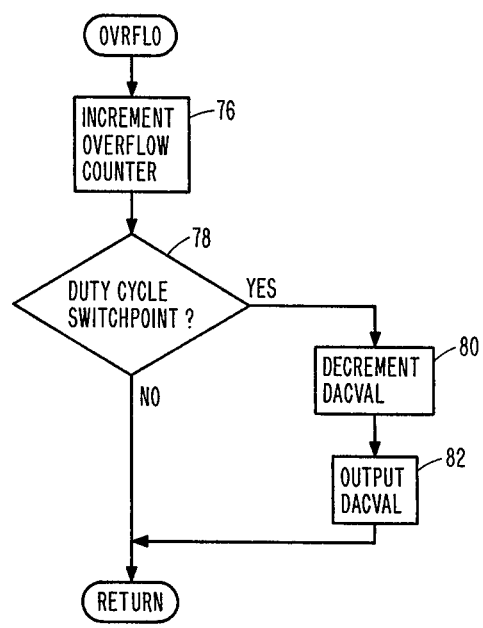
Figure 5C:
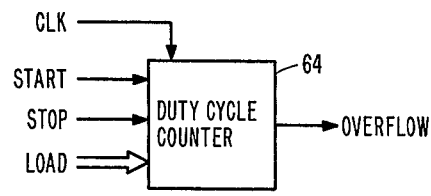

FIG.'s 5A and 5B are flowcharts of programs for operating microcomputer 40 in FIG. 4 to produce the duty cycle modulated digital word applied to the input of the DAC conversion stages;

FIG. 5C is a representation of the duty cycle counter implemented within microcomputer 40;

FIG.'s 6A, 6B and 6C show examples of duty cycle modulated signals occurring at node 50 in FIG. 4 along with the corresponding contents of the duty cycle counter (FIG. 5C) during the duty cycle period.

DETAILED DESCRIPTION

Figure 1:
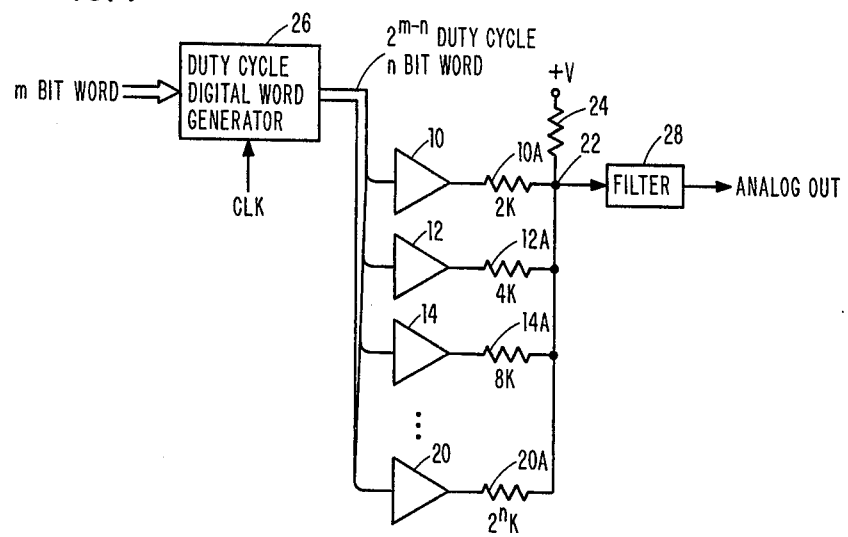
FIG. 1 shows a first preferred embodiment of the present invention having n conversion stages and a duty cycle, digital word generator to convert an m bit digital word to an n bit word duty cycle modulated to one of 2 raised-to-the-power (m-n) proportional intervals within the duty cycle.

Referring now to FIG. 1, an m bit word is to be converted into an analog voltage using n conversion stages where n is less than m. The highest order n bits of the m bit word represent a digital value to be converted into an analog value by the n conversion stages. The remaining m-n bits represent the modulation coefficient and are used to select the duty cycle modulation for the n bit word applied to the n conversion stages. The number of different duty cycle modulations that may be selected to finish converting the m bit word into an analog voltage is equal to 2 raised-to-the-power m-n.

Each conversion stage is made up of a driver amplifier and a resistor whose value is inversely proportional to the binary to analog conversion represented by that stage. Thus, the most significant n bit is converted by driver 10 driving into 2,000 ohm resistor 10A. Similarly, drivers 12 and 14 for the second and third most significant n bits drive into 4,000 ohm resistor 12A and 8,000 ohm resistor 14A, respectively. The nth conversion stage for the least significant n bit consists of driver 20 driving into resistor 20A having a resistance in ohms of 2 raised-to-the-power n and multiplied by 1000.

The output of each conversion stage is summed with the output from the other stages at node 22 connected to summing resistor 24 and to the input of filter 28. The input impedance of filter 28 is very high so as to not distort the summing function performed by resistor 24.

The conversion of the m bit word to a duty cycle modulated n bit word is accomplished by the duty cycle digital word generator 26 described hereinafter with reference to FIG. 2. Digital word generator 26 receives the m bit word and a clock signal. The period of the clock signal equals the duty cycle period divided by 2 raised-to-the-power (m-n). The highest n bits in the m bit word are passed through the generator and become the base DAC value, n bit word output from the generator. The lower order m-n bits in the m bit word are used to determine the portion of the clock period during which a one bit is added to the base DAC value. Thus, the n bit word output will fluctuate one binary count during the duty cycle, and the portion of the duty cycle period at each count value will depend upon the value of the lower order m-n bits in the m bit word.

Accordingly, the analog voltage at node 22 will be fluctuating between two levels during the clock cycle. Filter 28 removes this fluctuation or modulation on the analog output level at node 22. In effect, filter 28 is a low pass filter producing as its output a DC voltage equivalent to the DC component of the signal at node 22.

Figure 2:
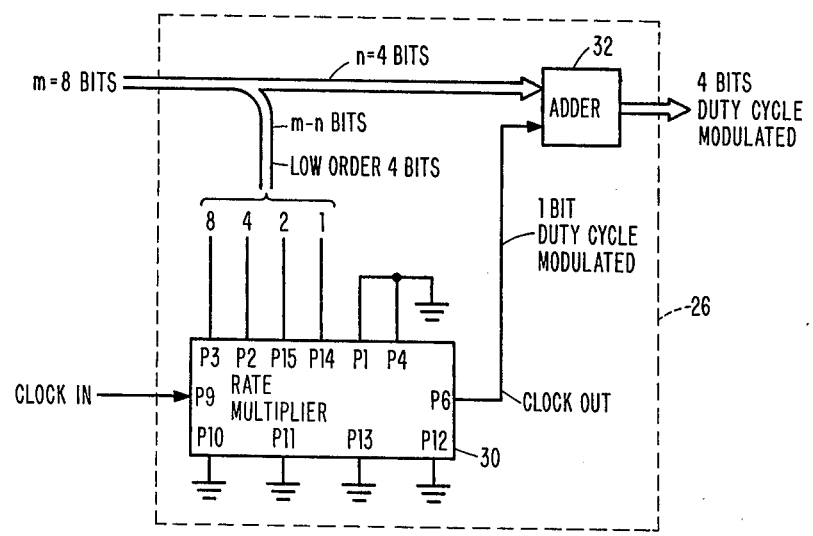
FIG. 2 shows the duty cycle, digital word generator of FIG. 1.

One implementation of the duty cycle digital word generator 26 is shown in FIG. 2. The generator consists of a rate multiplier 30 and a digital adder 32. The rate multiplier 30 could be, for example, a type SN5497 or SN7497 available from Texas Instruments Incorporated. In FIG. 2 the P numbers inside rate multiplier 30 represent pin numbers on the circuit chip available from Texas Instruments. Pins numbers 1, 2, 3, 4, 14 and 15 are rate input pins. Pin 9 is the clock input pin, while pin 6 is the clock output pin. Control pins 10, 11, 12 and 13 are respectively the strobe, the enable input, the unity cascade and the clear pins. In FIG. 2, these control pins have been grounded. Further, since the rate multiplier has a 6 bit input and the example in FIG. 2 utilizes only 4 bits, pins 1 and 4 have also been grounded.

The function of the rate multiplier 30 is to take CLOCK IN signal at pin 9 and generate a CLOCK OUT, whose rate is proportional to the binary value of binary word applied to the rate input pins. The CLOCK OUT from rate multiplier 30 may also be viewed as a one bit output word whose duration, as a binary zero or a binary one during the cycle of the CLOCK IN, is controlled by the binary word applied to the rate inputs of the rate multiplier.

If the rate input word has 4 bits as in the example in FIG. 2, rate multiplier 30 will divide CLOCK OUT into sixteen possible time intervals within the CLOCK IN cycle. The number of intervals high (binary one) will depend on the value of the four bit rate input word. For example, if the rate input word is 0111 (decimal 7), then CLOCK OUT would be a binary one (high) seven of the sixteen possible intervals. Rate multiplier 30 will distribute the seven high intervals as uniformly as possible over the sixteen intervals. An example is shown in FIG. 3 and will be described hereinafter.

The function of adder 32 in FIG. 2 is to add the one or zero of CLOCK OUT from rate multiplier 30 to the higher order n bits of the m bit word. In FIG. 2, the higher order 4 bits (n bits) of the 8 bit (m bit) word are passed directly to adder 32. Thus, adder 32 takes the higher order 4 bits and adds a binary 1 or 0 to produce a 4 bit duty cycle modulated word output. This output is applied to drivers 10 to 20 in the digital-to-analog conversion stages of FIG. 1.

Figure 3:
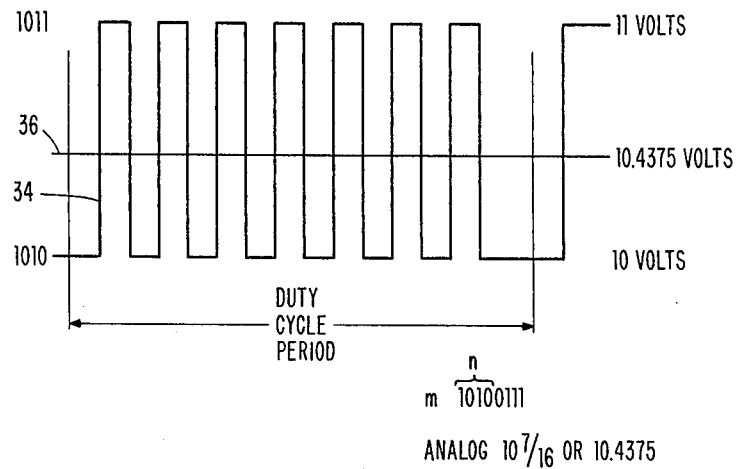
FIG. 3 shows a typical duty cycle modulated signal occurring at node 22 in FIG. 1.

An example of the operation of the duty cycle modulated, digital-to-analog converter in FIG. 1 is shown in the signal waveforms of FIG. 3. The m bit word, 10100111, is 8 bits long. The base DAC value (n bit word within the m bits) is 1010, and the m-n bit duty cycle word is 0111, corresponding to 7/16ths duty cycle proportion.

As shown in FIG. 3, the base word (1010), when incremented by one by the adder 32 in FIG. 2, modulates between 1010 and 1011 during the duty cycle period. The amount of modulation is controlled by the last 4 bits in the 8 bit word. Since these bits are 0111 they represent a duty cycle modulation of 7/16ths. Waveform 34 in FIG. 3 is the signal that appears at node 22 in FIG. 1. If the DAC is designed so that binary 1010 corresponds to 10 volts and binary 1011 corresponds to 11 volts as depicted in FIG. 3, then DC level 36, equal to 10.4375 volts, is the output of filter 28 in FIG. 1.

While in the example of FIG. 3, the binary 4 bit base value of 1010 was assigned 10 volts, the actual analog value assigned each base digital level is a matter of choice. It depends upon the values of resistors 10A to 20A and resistor 24 as well as the value of the bias voltage applied to resistor 24 and the output voltages from drivers 10 to 20.

Also, the example in FIG. 3 represents m=8 and n=4. Any m and n values may be selected that are convenient. Of course, n must correspond to the number of conversion stages available in the digital-to-analog converter.

Referring now to FIG. 4, an alternative preferred embodiment is shown. In this embodiment of the invention, the duty cycle digital word generator function is performed by microcomputer 40. The microcomputer is capable of providing a very large number of different duty cycle modulations. Thus even if the number of conversion stages is small, the number of output analog levels can be quite large. In this embodiment the smoothing of the modulated analog output is performed by DC motor 42. The microcomputer is a type 8048 available from Intel Corporation.

The digital-to-analog conversion stages in FIG. 4 consist of four drivers 52, 54, 56 and 58 driving resistors 52A, 54A, 56A and 58A, respectively. The values of resistors 52A through 58A increase as a power of 2 from 2,000 ohms for resistor 52A up to 16,000 ohms for resistor 58A. Each of the drives in the conversion stage is a type SN7406, available from Texas Instruments Incorporated.

An additional driver 60 is provided as an on-off control for the motor 42. Driver 60 when turned on by microcomputer 40 drives the voltage at summing node 50 near to ground and overrides the digital-to-analog conversion operation of the conversion stages 52 through 58. With the voltage at node 50 near ground, motor 42 is turned off.

When driver 60 is turned off, its output is an open collector connection so that it is effectively out of the circuit. Resistor 46 then establishes the voltage at the summing node 50 at some selectable level depending on which drivers 52 through 58 are turned on. Each driver, when on, drives its output near ground and, when off, is effectively out of the circuit. For example, if all drivers 52 through 58 are on, then resistors 52A through 58A are connected to ground. Resistor 46 is a 2,000 ohm resistor, while resistor 48 is a 100,000 ohm resistor. The parallel resistance of resistors 52A through 58A and resistor 48 is about 1,000 ohms. Therfore with all drivers 52 through 58 on, the voltage at node 50 will be near 8 volts.

Resistor 48, being a 100,000 ohm resistor, has a small effect on the parallel resistance to ground of resistors 52A through 58A. The purpose of resistor 48 and the 4.8 nf capacitor 44 is to suppress noise. Resistor 48 and capacitor 44 may be eliminated without altering the function of the invention.

DC motor 42 is driven by the voltage at summing node 50 through a Darlington circuit 62. During a predetermined signal period, voltage at node 50 will modulate between two analog levels. This modulated analog voltage at node 50 provides the drive for the DC motor 42 through the drive transistors in the Darlington circuit 62.

In operation, microcomputer 40 provides on-off control to motor 42 via driver 60 and provides the duty cycle modulated digital word on an output port to the four digital-to-analog conversion stages 52 through 58. As previously explained for FIG. 1, the duty cycle modulated digital word is modulated by one count during a duty cycle period to determine the proportional shares of the period at the upper and lower count. In the embodiment of FIG. 4, as clearly shown by the node 50 signal waveforms in FIG.'s 6A-6C, the modulation occurs only once per period.

Microcomputer 40 in FIG. 4 generates the duty cycle modulated digital word for the conversion stages by outputting a base digital word and decrementing that word by one count during the duty cycle period. The duty cycle of the modulation during that period is controlled by a counter function implemented within the microcomputer. FIGS. 5A and 5B are program flowcharts of the program in the 8048 microcomputer that generates the duty cycle modulated digital word. FIG. 5C is a pictorial representation of the duty cycle counter function within the 8048 microcomputer as controlled by the programs represented in FIGS. 5A and 5B. The programs represented by FIGS. 5A and 5B would be implemented in assembler language for the Intel 8048 microcomputer.

Briefly, microcomputer 40 operates to output a base DAC value at the beginning of each duty cycle period. Sometime during the period that DAC value is decremented by one to achieve the desired duty cycle modulation. The amount of modulation is controlled by a modulation coefficient controlling the duty cycle counter function within the microcomputer. The modulation coefficient sets the initial count in the duty cycle counter and sets the overflow condition used as the switch point for the duty cycle modulation as explained hereinafter.

Figure 6A:
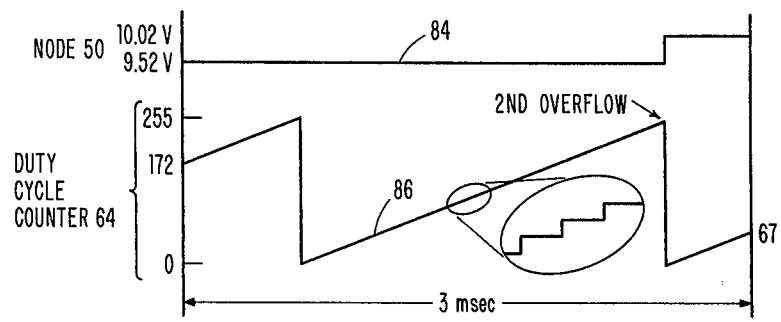
Figure 6B:
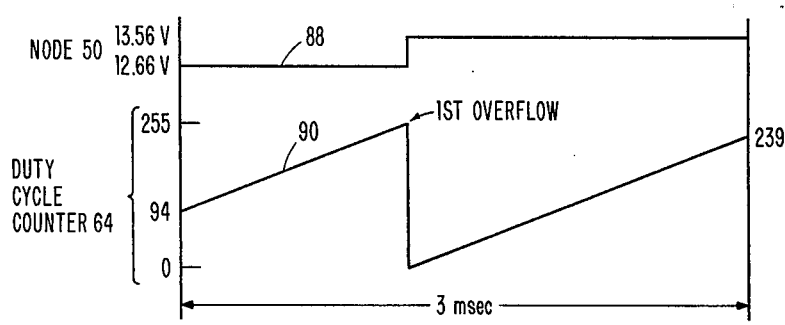
Figure 6C:
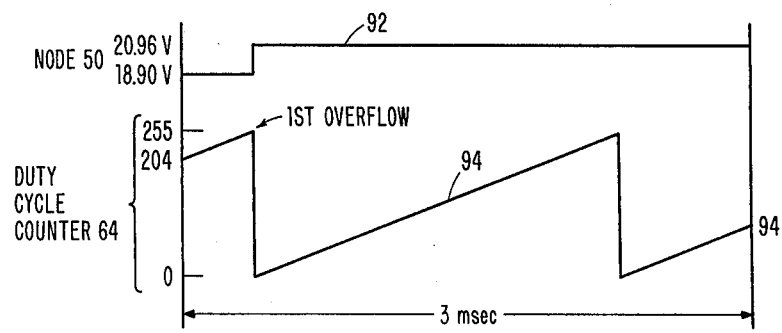

In the preferred embodiment, duty cycle counter 64 in FIG. 5C counts from 0 to 255. If the duty cycle period is predefined as three milliseconds and if the clock for the microcomputer is operated at 133.33 kilohertz (a clock period of 7.5 microseconds), then the duty cycle period will be divided into 400 counts during the 3 milliseconds of its duration. Since counter 64 counts up to 255, there is the possibility of two overflows from the counter depending upon the initial count loaded into the counter when it starts to count at the beginning of a signal period. Accordingly, the modulation coefficient is defined by loading a predetermined count into the counter and selecting which overflow, first or second is to be used. The selected overflow condition is used to trigger the duty cycle switchpoint during the 3 millisecond duty cycle period. Examples of the use of counter 64 with its overflows to control duty cycle modulation of 15%, 60%, and 87% are shown in FIGS. 6A, 6B, and 6C, respectively.

To operate as above summarized, the programs in FIGS. 5A and 5B require the starting base DAC value, the initial count for the duty cycle counter 64 (FIG. 5C) and an indication of whether the first or second overflow is to be used for the duty cycle switchpoint. This information is stored in the memory in the 8048 microcomputer or, if necessary, in an add-on read only memory (ROM) 41. The following table shows the required values to be used for "Base DAC Value," "Initial Count" and "Duty Cycle Switchpoint" to produce 0.1 volt increments of "Average DAC Voltage" in the apparatus of FIG. 4. The table also indicates the "Base DAC Voltage" resulting at node 50 (FIG. 4) for each base DAC value and the "Duty Cycle (%)" used for each average DAC voltage.

DAC Output Table

| Average DAC Voltage | Base DAC Value | Initial Count | Duty Cycle Switch-point | Base DAC Voltage | Duty Cycle (%) |
|---|---|---|---|---|---|
| 8.3 | 15 | 122 | 2 | 8.29 | 03 |
| 8.4 | 15 | 228 | 2 | 8.29 | 29 |
| 8.5 | 15 | 79 | 1 | 8.29 | 56 |
| 8.6 | 15 | 186 | 1 | 8.29 | 83 |
| 8.7 | 14 | 146 | 2 | 8.66 | 09 |
| 8.8 | 14 | 244 | 2 | 8.66 | 33 |
| 8.9 | 14 | 85 | 1 | 8.66 | 58 |
| 9.0 | 14 | 183 | 1 | 8.66 | 82 |
| 9.1 | 13 | 134 | 2 | 9.07 | 06 |
| 9.2 | 13 | 223 | 2 | 9.07 | 28 |
| 9.3 | 13 | 56 | 1 | 9.07 | 50 |
| 9.4 | 13 | 145 | 1 | 9.07 | 72 |
| 9.5 | 13 | 234 | 1 | 9.07 | 95 |
| 9.6 | 12 | 172 | 2 | 9.52 | 15 |
| 9.7 | 12 | 253 | 2 | 9.52 | 35 |
| 9.8 | 12 | 77 | 1 | 9.52 | 56 |
| 9.9 | 12 | 158 | 1 | 9.52 | 76 |
| 10.0 | 12 | 238 | 1 | 9.52 | 96 |
| 10.1 | 11 | 168 | 2 | 10.02 | 14 |
| 10.2 | 11 | 241 | 2 | 10.02 | 32 |
| 10.3 | 11 | 57 | 1 | 10.02 | 51 |
| 10.4 | 11 | 130 | 1 | 10.02 | 69 |
| 10.5 | 11 | 202 | 1 | 10.02 | 87 |
| 10.6 | 10 | 129 | 2 | 10.57 | 04 |
| 10.7 | 10 | 194 | 2 | 10.57 | 21 |
| 10.8 | 10 | 3 | 1 | 10.57 | 37 |
| 10.9 | 10 | 68 | 1 | 10.57 | 53 |
| 11.0 | 10 | 132 | 1 | 10.57 | 69 |
| 11.1 | 10 | 197 | 1 | 10.57 | 86 |
| 11.2 | 9 | 117 | 2 | 11.19 | 02 |
| 11.3 | 9 | 175 | 2 | 11.19 | 16 |
| 11.4 | 9 | 233 | 2 | 11.19 | 31 |
| 11.5 | 9 | 35 | 1 | 11.19 | 45 |
| 11.6 | 9 | 93 | 1 | 11.19 | 59 |
| 11.7 | 9 | 150 | 1 | 11.19 | 74 |
| 11.8 | 9 | 208 | 1 | 11.19 | 88 |
| 11.9 | 8 | 121 | 2 | 11.88 | 02 |
| 12.0 | 8 | 172 | 2 | 11.88 | 15 |
| 12.1 | 8 | 223 | 2 | 11.88 | 28 |
| 12.2 | 8 | 18 | 1 | 11.88 | 41 |
| 12.3 | 8 | 69 | 1 | 11.88 | 53 |
| 12.4 | 8 | 120 | 1 | 11.88 | 66 |
| 12.5 | 8 | 171 | 1 | 11.88 | 79 |
| 12.6 | 8 | 222 | 1 | 11.88 | 92 |
| 12.7 | 7 | 127 | 2 | 12.66 | 04 |
| 12.8 | 7 | 171 | 2 | 12.66 | 15 |
| 12.9 | 7 | 216 | 2 | 12.66 | 26 |
| 13.0 | 7 | 5 | 1 | 12.66 | 37 |
| 13.1 | 7 | 50 | 1 | 12.66 | 49 |
| 13.2 | 7 | 94 | 1 | 12.66 | 60 |
| 13.3 | 7 | 139 | 1 | 12.66 | 71 |
| 13.4 | 7 | 184 | 1 | 12.66 | 82 |
| 13.5 | 7 | 228 | 1 | 12.66 | 93 |
| 13.6 | 6 | 127 | 2 | 13.56 | 04 |
| 13.7 | 6 | 166 | 2 | 13.56 | 14 |
| 13.8 | 6 | 204 | 2 | 13.56 | 23 |
| 13.9 | 6 | 243 | 2 | 13.56 | 33 |
| 14.0 | 6 | 26 | 1 | 13.56 | 43 |
| 14.1 | 6 | 65 | 1 | 13.56 | 52 |
| 14.2 | 6 | 104 | 1 | 13.56 | 62 |
| 14.3 | 6 | 143 | 1 | 13.56 | 72 |
| 14.4 | 6 | 181 | 1 | 13.56 | 82 |
| 14.5 | 6 | 220 | 1 | 13.56 | 91 |
| 14.6 | 5 | 114 | 2 | 14.59 | 01 |
| 14.7 | 5 | 148 | 2 | 14.59 | 09 |
| 14.8 | 5 | 181 | 2 | 14.59 | 18 |
| 14.9 | 5 | 214 | 2 | 14.59 | 26 |
| 15.0 | 5 | 248 | 2 | 14.59 | 34 |
| 15.1 | 5 | 25 | 1 | 14.59 | 43 |
| 15.2 | 5 | 58 | 1 | 14.59 | 51 |
| 15.3 | 5 | 92 | 1 | 14.59 | 59 |
| 15.4 | 5 | 125 | 1 | 14.59 | 68 |
| 15.5 | 5 | 158 | 1 | 14.59 | 76 |

DAC Output Table (continued)

| Average DAC Voltage | Base DAC Value | Initial Count | Duty Cycle Switch-point | Base DAC Voltage | Duty Cycle (%) |
|---|---|---|---|---|---|
| 15.6 | 5 | 192 | 1 | 14.59 | 84 |
| 15.7 | 5 | 225 | 1 | 14.59 | 93 |
| 15.8 | 4 | 114 | 2 | 15.79 | 01 |
| 15.9 | 4 | 142 | 2 | 15.79 | 08 |
| 16.0 | 4 | 171 | 2 | 15.79 | 15 |
| 16.1 | 4 | 199 | 2 | 15.79 | 22 |
| 16.2 | 4 | 227 | 2 | 15.79 | 29 |
| 16.3 | 4 | 255 | 0 | 15.79 | 36 |
| 16.4 | 4 | 28 | 1 | 15.79 | 43 |
| 16.5 | 4 | 56 | 1 | 15.79 | 50 |
| 16.6 | 4 | 84 | 1 | 15.79 | 57 |
| 16.7 | 4 | 112 | 1 | 15.79 | 64 |
| 16.8 | 4 | 141 | 1 | 15.79 | 71 |
| 16.9 | 4 | 169 | 1 | 15.79 | 78 |
| 17.0 | 4 | 197 | 1 | 15.79 | 86 |
| 17.1 | 4 | 226 | 1 | 15.79 | 93 |
| 17.2 | 4 | 254 | 1 | 15.79 | 100 |
| 17.3 | 3 | 134 | 2 | 17.20 | 06 |
| 17.4 | 3 | 157 | 2 | 17.20 | 12 |
| 17.5 | 3 | 181 | 2 | 17.20 | 17 |
| 17.6 | 3 | 204 | 2 | 17.20 | 23 |
| 17.7 | 3 | 228 | 2 | 17.20 | 29 |
| 17.8 | 3 | 252 | 2 | 17.20 | 35 |
| 17.9 | 3 | 19 | 1 | 17.20 | 41 |
| 18.0 | 3 | 43 | 1 | 17.20 | 47 |
| 18.1 | 3 | 67 | 1 | 17.20 | 53 |
| 18.2 | 3 | 90 | 1 | 17.20 | 59 |
| 18.3 | 3 | 114 | 1 | 17.20 | 65 |
| 18.4 | 3 | 137 | 1 | 17.20 | 71 |
| 18.5 | 3 | 161 | 1 | 17.20 | 77 |
| 18.6 | 3 | 185 | 1 | 17.20 | 82 |
| 18.7 | 3 | 208 | 1 | 17.20 | 88 |
| 18.8 | 3 | 232 | 1 | 17.20 | 94 |
| 18.9 | 2 | 111 | 2 | 18.90 | 00 |
| 19.0 | 2 | 131 | 2 | 18.90 | 05 |
| 19.1 | 2 | 150 | 2 | 18.90 | 10 |
| 19.2 | 2 | 170 | 2 | 18.90 | 15 |
| 19.3 | 2 | 189 | 2 | 18.90 | 20 |
| 19.4 | 2 | 208 | 2 | 18.90 | 24 |
| 19.5 | 2 | 228 | 2 | 18.90 | 29 |
| 19.6 | 2 | 247 | 2 | 18.90 | 34 |
| 19.7 | 2 | 11 | 1 | 18.90 | 39 |
| 19.8 | 2 | 30 | 1 | 18.90 | 44 |
| 19.9 | 2 | 49 | 1 | 18.90 | 49 |
| 20.0 | 2 | 69 | 1 | 18.90 | 53 |
| 20.1 | 2 | 88 | 1 | 18.90 | 58 |
| 20.2 | 2 | 108 | 1 | 18.90 | 63 |
| 20.3 | 2 | 127 | 1 | 18.90 | 68 |
| 20.4 | 2 | 146 | 1 | 18.90 | 73 |
| 20.5 | 2 | 166 | 1 | 18.90 | 78 |
| 20.6 | 2 | 185 | 1 | 18.90 | 83 |
| 20.7 | 2 | 204 | 1 | 18.90 | 87 |
| 20.8 | 2 | 224 | 1 | 18.90 | 92 |
| 20.9 | 2 | 243 | 1 | 18.90 | 97 |
| 21.0 | 1 | 117 | 2 | 20.96 | 02 |
| 21.1 | 1 | 133 | 2 | 20.96 | 05 |
| 21.2 | 1 | 148 | 2 | 20.96 | 09 |
| 21.3 | 1 | 164 | 2 | 20.96 | 13 |
| 21.4 | 1 | 179 | 2 | 20.96 | 17 |
| 21.5 | 1 | 195 | 2 | 20.96 | 21 |
| 21.6 | 1 | 211 | 2 | 20.96 | 25 |
| 21.7 | 1 | 226 | 2 | 20.96 | 29 |
| 21.8 | 1 | 242 | 2 | 20.96 | 33 |
| 21.9 | 1 | 1 | 1 | 20.96 | 37 |
| 22.0 | 1 | 17 | 1 | 20.96 | 40 |
| 22.1 | 1 | 32 | 1 | 20.96 | 44 |
| 22.2 | 1 | 48 | 1 | 20.96 | 48 |
| 22.3 | 1 | 64 | 1 | 20.96 | 52 |
| 22.4 | 1 | 79 | 1 | 20.96 | 56 |
| 22.5 | 1 | 95 | 1 | 20.96 | 60 |
| 22.6 | 1 | 110 | 1 | 20.96 | 64 |
| 22.7 | 1 | 126 | 1 | 20.96 | 68 |
| 22.8 | 1 | 141 | 1 | 20.96 | 72 |
| 22.9 | 1 | 157 | 1 | 20.96 | 75 |
| 23.0 | 1 | 173 | 1 | 20.96 | 79 |
| 23.1 | 1 | 188 | 1 | 20.96 | 83 |
| 23.2 | 1 | 204 | 1 | 20.96 | 87 |
| 23.3 | 1 | 219 | 1 | 20.96 | 91 |
| 23.4 | 1 | 235 | 1 | 20.96 | 95 |
| 23.5 | 1 | 250 | 1 | 20.96 | 99 |

FIG. 5A shows the INIT program that initializes the microcomputer 40 at the beginning of each duty cycle period. This program reinitializes duty cycle counter 64 starting it with the initial count in the DAC output table stored in memory. In addition, the program sets the overflow counter used by the overflow program in FIG. 5B to zero. Finally, the INIT program outputs the base DAC value as the digital word to be applied to the conversion stages 52 through 58 (FIG. 4) at the beginning of the duty cycle period.

In steps 66 through 69, the INIT program reinitializes the duty cycle counter 64. This is accomplished by step 66 stopping the counter, step 67 fetching the initial count for the desired average DAC voltage from the DAC output table and step 68 loading the initial count into the duty cycle counter. At step 69, the program starts duty cycle counter 64 counting at the clock rate.

At step 70 in the INIT program (FIG. 5A), the overflow counter (part of microcomputer 40) used by the overflow program (FIG. 5B) is reset to zero. In step 71 of the INIT program, the base DAC value for the desired average DAC voltage is fetched from the DAC output table. It is placed in a DACVAL register in the computer during step 72. This base DAC value is outputted through the output ports of the microcomputer to conversion stages 52 to 58 (FIG. 4) by step 73. Finally, the INIT program loads the duty cycle switchpoint into a register which will be subsequently used by the OVERFLO program in FIG. 5B. Accordingly, the INIT program in FIG. 5A has reinitialized the duty cycle counter, started it counting, set up the base DAC value output to the conversion stages and set up the switchpoint for the OVERFLO program to detect the switchpoint for the duty cycle modulation.

In FIG. 5B, the OVERFLO program begins when it receives an overflow signal from the duty cycle counter 64 (FIG. 5C). When this occurs, step 76 of the OVERFLO program increments the overflow counter. Since the overflow counter was previously reset to zero by the INIT program, then the first overflow will cause the overflow counter to increment to the value 1. Next, the OVERFLO program at decision step 78 checks to see if the contents of the overflow counter match the duty cycle switchpoint previously stored in a register by step 74 in the INIT program. If the duty cycle switchpoint has not been reached, then the OVERFLO program is exited, and program control returns to the main supervisory program used by the microcomputer.

If the overflow counter value does match the duty cycle switchpoint, then step 78 of the OVERFLO program branches program control to step 80. In step 80, the base DAC value for the conversion stages is decremented by one and loaded in the DACVAL register in the microcomputer. At step 82 the OVERFLO program outputs the contents of the DACVAL register to the conversion stages. Program control then exits from the OVERFLO program back to the supervisory control program for the microcomputer. This cycle of operation with the INIT and OVERFLO programs repeats every duty cycle period in the microcomputer and results in the DAC value on the output ports of the microcomputer being duty cycle modulated as shown in three examples in FIGS. 6A, 6B, and 6C.

In FIG. 6A, an example of a 15% duty cycle is shown for the output DAC voltage 9.6 volts in the DAC Output Table. From the DAC Output Table, the initial count loaded into the duty cycle counter for 9.6 is 172. The base DAC value is 12, and the duty cycle switchpoint is 2, the second overflow. The INIT program and OVERFLO programs operate as just described to produce an output signal 84 (FIG. 6A) at node 50 (FIG. 4). Waveform 86 in FIG. 6A indicates the contents of counter 64 during the 3 millisecond duty cycle period. For the base DAC value the voltage at node 50 in FIG. 4 is 9.52 volts. When the OVERFLO program decrements the base DAC value by one, the voltage at node 50 rises to 10.02 volts. Since this occurs at the 15% point in the duty cycle, the average DAC voltage is 9.6 volts.

In the example of FIG. 6B, there is only one overflow of the duty cycle counter, and the duty cycle switchpoint occurs at the overflow. This examples results in generation of an average DAC voltage of 13.2 volts. From the DAC Output Table, the initial count loaded into the duty cycle counter is 94, the base DAC value is 7 producing a base DAC voltage of 12.66 volts at node 50, and the duty cycle switchpoint is 1, the first overflow. Signal 88 is the signal that occurs at node 50 during the signal period, and waveform 90 corresponds to the contents of the duty cycle counter during the duty cycle period.

The example in FIG. 6C shows two overflow conditions where the duty cycle switchpoint occurs at the first overflow. This example corresponds to an average DAC voltage of 20.70 volts. From the DAC Output Table, the initial count is 204, the base DAC value is 2, which corresponds to 18.90 volts at node 50, and the duty cycle switchpoint is 1, the first overflow. Signal 92 is the voltage signal appearing at node 50, and the waveform 94 indicates the contents of the duty cycle counter during the duty cycle period.

While the examples in the DAC Output Table produce increments of 1/10 of a volt, it should be apparent from the examples in FIGS. 6A through 6C, that any initial count and either the first or second overflow condition can be used to produce an almost unlimited variety of duty cycle switchpoints. Thus, the increment of voltages available from the duty cycle modulated DAC in FIG. 4 is limited only by the resolution achievable with the duty cycle counting function implemented in the microcomputer 40.

It will be appreciated also by one skilled in the art that a signal period of 3 milliseconds and a clock frequency of 133.33 kilohertz are matters of choice. Other signal periods and frequencies might be selected depending upon the implementation desired. Furthermore, in addition to an open loop operation for control of the DC motor 42 in FIG. 4 by use of table look-up to define the motor speed, it would be possible to provide a closed loop operation and program the microcomputer 40 to adjust the modulated base DAC value to control the speed of motor 42.

While we have illustrated and described the preferred embodiments of our invention, it is understood that we do not limit ourselves to the precise constructions herein disclosed and the right is reserved to all changes and modifications coming within the scope of the invention as defined in the appended claims.

What is claimed is:

1. Apparatus for generating a duty cycle modulated digital value and an analog signal level therefrom, said apparatus comprising:

conversion means for converting a digital value to an analog signal level;

storage means for storing a base digital value, an overflow count, and an initial count for each desired analog signal level;

data processing means comprising:
  address means for selecting from said storage means a base digital value, an overflow count and an initial count;
  output means for providing the base digital value to said conversion means at the beginning of the duty cycle period;
  means for changing the base digital value to a second digital value at a switchpoint in the duty cycle period;
  means for counting intervals of time within the duty cycle period, said counting means indicating overflow conditions during the duty cycle period when said counting means wraps around from maximum count to zero count;
  means for loading said counting means with the selected initial count;
  means for detecting the duty cycle switchpoint at one of the overflow conditions indicated by said counting means;
  means for indicating to said detecting means the selected overflow count indicating the overflow condition at which the switchpoint is to occur whereby the overflow count and the initial count may be selected to provide the desired switchpoint and thus the desired modulation;

smoothing means for smoothing out the modulation of the analog signal from said conversion means so that the smoothed analog signal level corresponds to a value equivalent to the modulated digital value.

2. The apparatus of claim 1 wherein said smoothing means comprises:

a DC motor driven by said modulated analog signal and having a frequency response such that the motor operates as if driven by a constant analog signal level converted from the modulated digital value.

3. The apparatus of claim 1 wherein said smoothing means comprises:

filter means for filtering the modulated analog signal to produce a constant analog signal level corresponding to a digital value equivalent to the modulated digital value.

* * * * *